(12) United States Patent
Ziegler

(10) Patent No.: US 6,238,946 B1
(45) Date of Patent: May 29, 2001

(54) PROCESS FOR FABRICATING SINGLE CRYSTAL RESONANT DEVICES THAT ARE COMPATIBLE WITH INTEGRATED CIRCUIT PROCESSING

(75) Inventor: James F. Ziegler, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/375,940

(22) Filed: Aug. 17, 1999

(51) Int. Cl.[7] .................................................. H01L 21/00
(52) U.S. Cl. ........................... 438/50; 438/343; 257/584; 257/586; 257/587; 257/414; 257/415; 257/416; 257/417
(58) Field of Search ..................... 438/50, 343; 257/584, 257/586, 587, 414–417

(56) References Cited

U.S. PATENT DOCUMENTS

| | | |
|---|---|---|
| 3,634,787 | 1/1972 | Newell . |
| 3,983,477 | 9/1976 | Stuchly et al. . |
| 4,232,265 | 11/1980 | Smirnov . |
| 5,594,331 | 1/1997 | White et al. . |
| 5,696,491 | 12/1997 | White et al. . |
| 5,748,057 | * 5/1998 | De Los Santos ..................... 333/134 |
| 5,856,722 | * 1/1999 | Haronian et al. ..................... 310/321 |
| 5,880,921 | * 3/1999 | Tham et al. .......................... 361/233 |

(List continued on next page.)

OTHER PUBLICATIONS

"Micromachined Devices for Wireless Communications", by Nguyen et al., Proceedings of the IEEE, vol. 86, No. 8, Aug. 1998, pp. 1756–1768.

"Surface Micromachining for Microelectromechanical Systems", by Bustillo, et al., Proceedings of the IEEE, vol. 86, No. 8, Aug. 1998, pp. 1552–1574.

"High–Q Micromechanical Oscillators and Filters for Communications", by Nguyen et al., 1997 IEEE International Symposium on Circuits and Systems, Jun. 9–12, 1997, Hong Kong, pp. 2825–2828.

"Bulk Micromachining of Silicon", by Kovacs, et al., Proceedings of the IEEE, vol. 86, No. 8, Aug. 1998, 1536–1551.

"Development of Miniature Filters for Wireless Applications", by Lakin, et al., IEEE Transactions on Microwave Theory and Techniques, No. 43, No. 12, Dec. 1995, pp. 2933–2939.

"Micromachined Micropackaged Filter Banks", by Brown, et al., IEEE Microwave and Guided Wave Letters, vol. 8, No. 4, Apr. 1998, pp. 158–160.

(List continued on next page.)

Primary Examiner—Matthew Smith
Assistant Examiner—Granvill D Lee
(74) Attorney, Agent, or Firm—Scully, Scott, Murphy & Presser; Daniel P. Morris, Esq.

(57) ABSTRACT

This invention describes fabrication procedures to construct MEMS devices, specifically band-pass filter resonators, in a manner compatible with current integrated circuit processing. The final devices are constructed of single-crystal silicon, eliminating the mechanical problems associated with using polycrystalline silicon or amorphous silicon. The final MEMS device lies below the silicon surface, allowing further processing of the integrated circuit, without any protruding structures. The MEMS device is about the size of a SRAM cell, and may be easily incorporated into existing integrated circuit chips. The natural frequency of the device may be altered with post-processing or electronically controlled using voltages and currents compatible with integrated circuits.

8 Claims, 8 Drawing Sheets

U.S. PATENT DOCUMENTS

| | | | | |
|---|---|---|---|---|
| 5,976,994 | * | 11/1999 | Nguyen et al. | 438/795 |
| 5,994,982 | * | 11/1999 | Kintis et al. | 333/235 |
| 6,049,702 | * | 4/2000 | Tham et al. | 455/78 |
| 6,051,866 | * | 8/1998 | Shaw et al. | 257/417 |
| 6,137,383 | * | 6/1999 | DeLillo | 333/210 |
| 6,150,901 | * | 11/1998 | Auken | 333/174 |

OTHER PUBLICATIONS

"Fabrication of high frequency nanometer scale mechanical resonators from bulk Si crystals", by Cleland, et al., 1996 American Institute of Physics, Oct. 28, 1996, pp. 2653–2655.

"Frequency–Selective MEMS for Minaturized Communication Devices", by Nguyen, 1998 IEEE Aerospace Conference Prceedings, vol. 1, Mar. 21–28, 1998, pp. 445–460.

"Electrothermal Frequency Tuning of Folded and Coupled Vibrating Micromechanical Resonators", by Syms, Journal of Microelectromechanical Systems, vol. 7,, No. 2, Jun. 1998, pp. 164–171.

* cited by examiner

MEMS Cantilever RF Band Pass Filter

US 6,238,946 B1

PROCESS FOR FABRICATING SINGLE CRYSTAL RESONANT DEVICES THAT ARE COMPATIBLE WITH INTEGRATED CIRCUIT PROCESSING

BACKGROUND OF THE INVENTION

1. Field of the Invention

The present invention is directed to systems and methods for fabricating integrated circuit resonant devices, and particularly a process for manufacturing integrated circuit (IC) band-pass filters using micro electro-mechanical system (MEMS) technology on single crystal silicon-on-insulator (SOI) wafers in a manner consistent with current integrated circuit fabrication techniques.

2. Discussion of the Prior Art

Micro Electro-Mechanical Systems (MEMS) technology is currently implemented for the fabrication of narrow bandpass filters (high-Q filters) for various UHF and IF communication circuits. These filters use the natural vibrational frequency of micro-resonators to transmit signals at very precise frequencies while attenuating signals and noise at other frequencies. FIG. 1 illustrates a conventional MEMS bandpass filter device 10 which comprises a semiconductive resonator structure 11, e.g., made of polycrystalline or amorphous material, suspended over a planar conductive input structure 12, which is extended to a contact 13. An alternating electrical signal on the 12 input will cause an image charge to form on the resonator 11, attracting it and deflecting it downwards. If the alternating signal frequency is similar to the natural mechanical vibrational frequency of the resonator, the resonator may vibrate, enhancing the image charge and increasing the transmitted AC signal. The meshing of the electrical and mechanical vibrations selectively isolates and transmits desired frequencies for further signal amplification and manipulation. It is understood that the input and output terminals of this device may be reversed, without changing its operating characteristics.

Typically, resonator filter devices 10 are fabricated by standard integrated circuit masking/deposition/etching processes. Details regarding the manufacture and structure of MEMS band-pass filters may be found in the following references: 1) C. T. -C. Nguyen, L. P. B. Katehi and G. M. Rebeiz "Micromachined Devices for Wireless Communications", Proc. IEEE, 86, 1756–1768; 2) J. M. Bustillo, R. T. Howe and R. S. Muller "Surface Micromachining for Microelectromechanical Systems", Proc. IEEE, 86, 1552–1574 (1998); 3) C. T. -C. Nguyen, "High-Q Micromechanical Oscillators and Filters for Communications", IEEE Intl. Symp. Circ. Sys., 2825–2828 (1997); 4) G. T. A. Kovacs, N. I. Maluf and K. E. Petersen, "Bulk Micromachining of Silicon", Proc. IEEE 86, 1536–1551 (1998); 5) K. M. Lakin, G. R. Kline and K. T. McCarron, "Development of Miniature Filters for Wireless Applications", IEEE Trans. Microwave Theory and Tech., 43, 2933–2939 (1995); and, 6) A. R. Brown, "Micromachined Micropackaged Filter Banks", IEEE Microwave and Guided Wave Lett.,8, 158–160 (1998).

The reference 7) N. Cleland and M. L. Roukes, "Fabrication of High Frequency Nanometer Scale Mechanical Resonators from Bulk Si Crystals", Appl. Phys. Lett, 69, 2653–2655 (1996) describes the advantages of using single crystal resonators as band-pass filters. The references 8) C. T. -C. Nguyen, "Frequency-Selective MEMS for Miniaturized Communication Devices", 1998 IEEE Aerospace Conf. Proc., 1, 445–460 (1998) and 9) R. A. Syms, "Electrothermal Frequency Tuning of Folded and Coupled Vibrating Micromechanical Resonators, J. MicroElectroMechanical Sys., 7, 164–171 (1998) both discuss the effects of heat on the stability of micro-mechanical band-pass filters. Of particular relevance as noted in these references is the acknowledgment that the existing processes for making MEMS bandpass filters have serious drawbacks. For instance, as most resonators are made of polycrystalline or amorphous materials to simplify fabrication, there is exhibited an increase in mechanical energy dissipation which softens the natural frequency of oscillation, as noted in above-mentioned references 1)–3). Etching polycrystalline materials does not allow for device features smaller than the polycrystalline grain size, which creates rough surfaces and prevents precise mechanical characteristics. For example, above-mentioned references 1) and 2) both detail the problems encountered when polycrystalline material is used in MEMS resonators. Additionally, in reference 7), there is described the construction of resonators made of single-crystal silicon including a description of an attempt to use complex dry-etch techniques to obtain single-crystal resonators. The reference reports such resonator structures having scalloped edges, which reduces the precision of the final mechanical performance to that of polycrystalline structures. That is, their etch-process produced surface roughness that was similar to that of polycrystalline materials.

Other attempts to use single-crystal silicon have been reviewed in reference 4), however, these attempts were made to eliminate the poor device performance when polycrystalline materials were used for construction. Most used anisotropic etches to undercut single-crystal silicon surfaces and construct resonators (and other structures). In all cases, the structures were quite large, in part to minimize the effects of surface roughness and non-parallel surfaces on the device performance. Since the devices were very large, they were useful only for low-frequency applications (below 100 MHz), which is of limited usefulness as a communication frequency filter in the commercial band of 300–6000 MHz.

A further limitation of all MEMS band-pass structures is that they are formed above the silicon surface (see references 1–9). This makes the structures incompatible with standard integrated circuit fabrication, since it prevents "planarization". After the devices of an integrated circuit have been fabricated, the wafer enters its final processing which is called "metallization" and "planarization". Before this step, all the devices on the wafer are isolated, and for integration they must be connected together with metal wires. In modern devices, the wiring is done as a series of layers, each containing wiring in certain directions (i.e., metallization). After each layer is deposited, the wafer surface is smoothed, i.e., is planarized so that subsequent layers of wiring may be deposited on a smooth surface. Planarization is typically done by chemical-mechanical polishing (CMP processing) or by melting a thin layer of glass over the surface. If there is a micro-mechanical device protruding up above the surface, it would be immediately destroyed by either of the above planarization processes.

Additional prior art patented devices such as described in U.S. Pat. No. 3,634,787 (1972), U.S. Pat. No. 3,983,477 (1976), and U.S. Pat. No. 4,232,265A (1980) describe similar mechanical resonatored structures, but which are incompatible with integrated circuit processing.

For instance, U.S. Pat. No. 3,634,787 describes an electro-mechanical resonator band-pass filter device having a mechanical component consisting of a support being a unitary body of semiconductor material and having a piezo-electric field effect transducer therein. Thus, its electrical operation relies upon the piezoelectrical effect. U.S. Pat. No.

3,983,477 describes a ferromagnetic element tuned oscillator located close to a high-voltage current carrying conductor, however, as such, its electrical operation relies on the ferromagnetic effect. U.S. Pat. No. 4,232,265A describes a device for converting the intensity of a magnetic or an electromagnetic field into an electric signal wherein movable elements are made as ferromagnetic plates. Likewise, its electrical operation relies upon the ferromagnetic effect. U.S. Pat. No. 5,594,331 describes a self-excitation circuitry connected to a resonator to process induced variable frequency voltage signals in a resonant pass band and is of exemplary use as a power line sensor. Likewise, U.S. Pat. No. 5,696,491 describes a microelectromechanical resonating resonator which responds to physical phenomenon by generating an induced variable frequency voltage signal corresponding to the physical phenomenon and thus, does not lend itself to manufacture by current integrated circuit fabrication technology.

It would thus be highly desirable to construct an IC MEMS band-pass filter device in a manner consistent with current integrated circuit fabrication techniques that avoids completely or reduces significantly all of the above-described limitations.

SUMMARY OF THE INVENTION

It is an object of the present invention to provide an improved IC MEMS resonator band-pass filter device of a construction that lends itself to manufacture in accordance with current IC manufacturing techniques and that overcomes the fundamental weaknesses as outlined in the above-mentioned references. Particularly, according to one aspect of the invention, there is provided a resonatored MEMS bandpass filter device that is constructed of single-crystal silicon, eliminating the mechanical problems associated with using polycrystalline or amorphous materials. The final MEMS device lies below the silicon surface, allowing further processing of the integrated circuit, without any protruding structures. The MEMS device is about the size of a SRAM cell, and may be easily incorporated into existing integrated circuit chips. The natural frequency of the device may be altered with post-processing, or electronically controlled using voltages and currents compatible with integrated circuits.

According to another aspect of the invention, there is provided a novel resonatored MEMS bandpass filter device fabrication technique for constructing such MEMS devices in a manner compatible with current integrated circuit processing.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1:
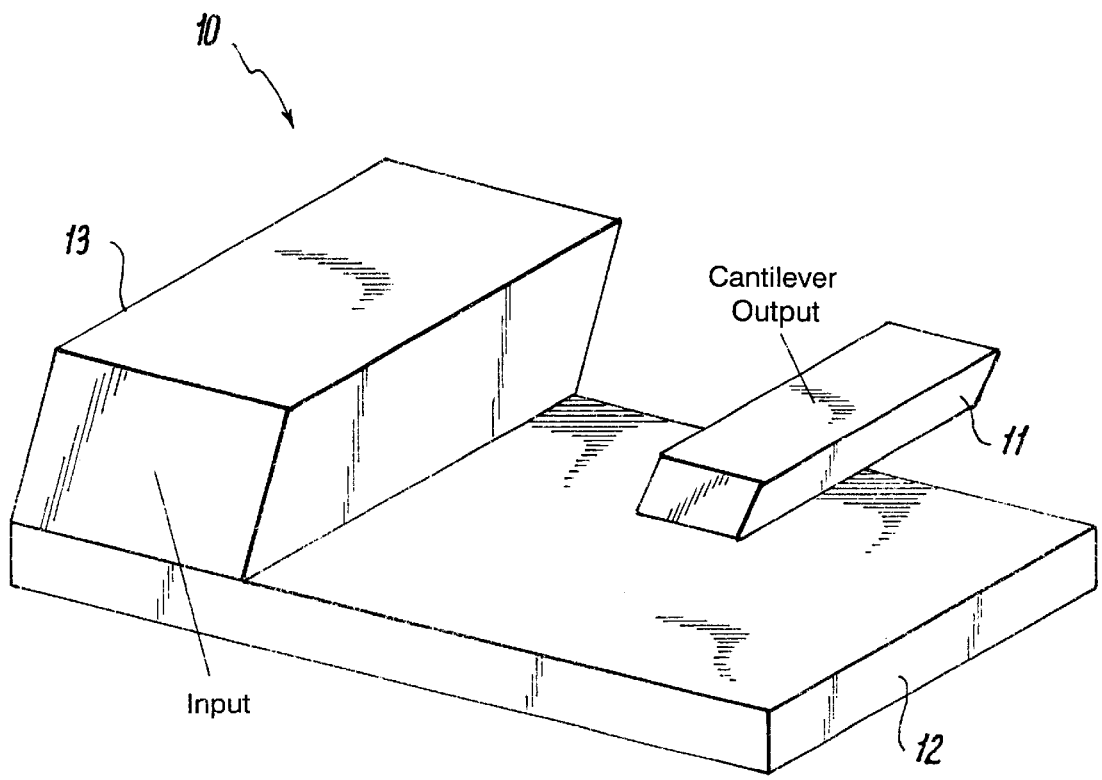
FIG. 1 is a schematic diagram of a conventional MEMS bandpass filter device of a suspended resonator design.
Figure 2A:
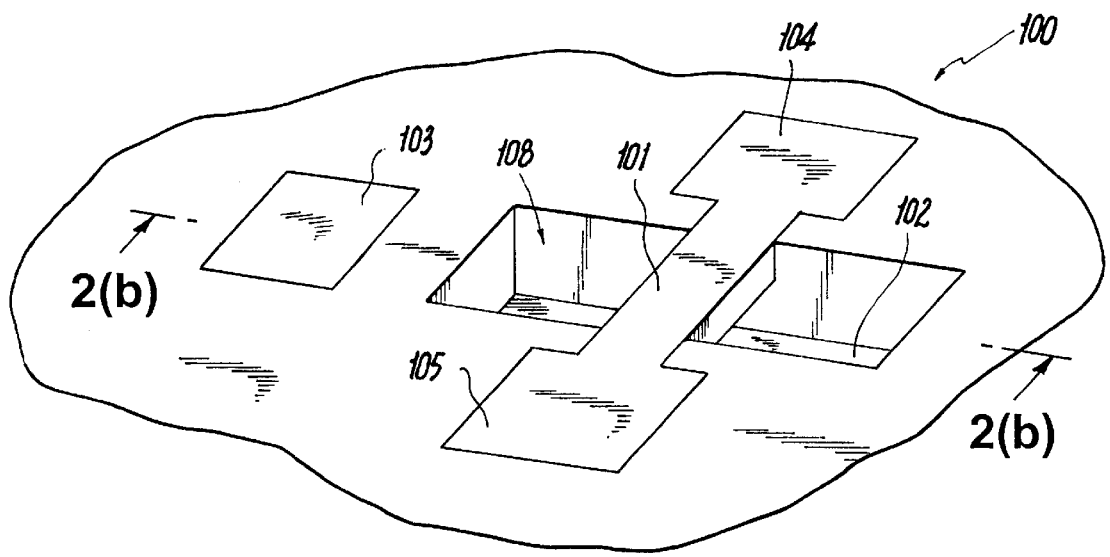
FIG. 2(a) is a schematic isometric diagram of a MEMS bandpass filter fabricated with a buried planar input contact according to a first embodiment of the invention.
Figure 2B:
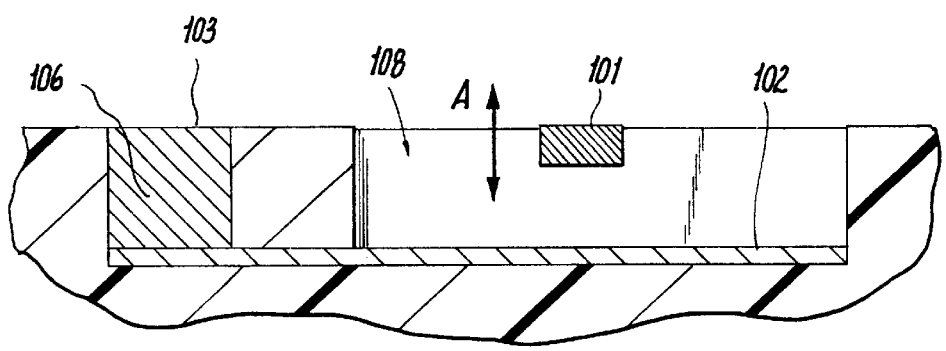
FIG. 2(b) is a side view of this same device.

FIGS. 2(a) and 2(b) illustrate respective isometric and side views of a novel resonatored MEMS bandpass filter device 100 manufactured according to a first embodiment of the invention. As shown in FIGS. 2(a) and 2(b), the device is fabricated to have an input contact 103 for diverting a received electrical signal downwards through connection 106 to a bottom planar contact 102. A well 108 is created in the silicon surface, and a resonator 101 straddles this well and is free to vibrate. The resonator 101 is electrically connected to an output pad 105, which propagates the final filtered signal. The input contact 103 is capacitively coupled to the resonator 101, so that the input signal will cause the resonator to vibrate in the vertical direction as indicated by the arrow A in FIG. 2(b). The resonator has a natural frequency of vibration, based on its dimensions and material, and signals of this frequency (or its harmonics) are preferentially propagated through the resonator to the output terminal 105. The natural frequency of the device may be tuned by heating the resonator, and changing its elastic constant. This may be accomplished by fabrication of a pad 104 which functions to enable a current to be sent through the resonator to pad 105 and consequently heat up the resonator.

As described in the reference to H. J. McSkimin, J. Appl. Phys., 24, 988 (1953), and Yu. A. Burenkov and S. P. Nikanorov, Sov. Phys. Sol. State, 16, 963 (1974) the elastic constant of single crystal silicon varies with temperature. Further as described in the reference H. Guckel, Tech. Digest, IEEE Solid-State Sensor and Actuator Workshop, June, 1988, 96–99, the elastic constant of polycrystalline silicon varies with temperature. In accordance with these references, the heating of silicon by 100° C. will change its elastic constant by about 0.9%, which may modify the resonator natural frequency by about 0.4%. For a 1 GHz natural frequency, this provides a tuning band of 4 MHz by controlling the resonator temperature. Measurements of such frequency changes may be made in accordance with conventional techniques (see above-mentioned references 8 and 9). In accordance with the invention, the thermal properties are used to tune the device, and improve its performance and flexibility.

Figure 3A:
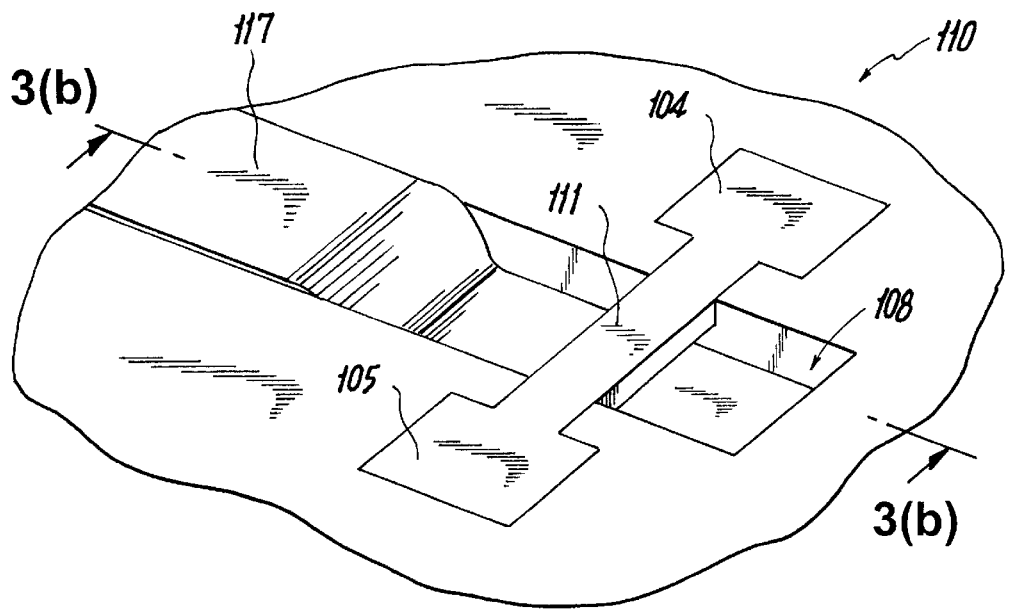
FIGS. 3(a) and 3(b) are schematic isometric and side view diagrams of a MEMS bandpass filter fabricated with the input contact in a sunken well according to a second embodiment of the invention.
Figure 3B:
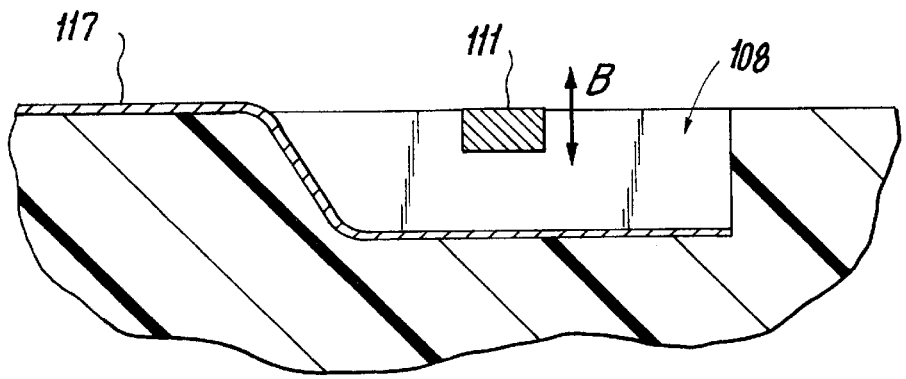

FIGS. 3(a) and 3(b) illustrate respective isometric and side views of a novel resonatored MEMS bandpass filter device 110 manufactured according to a second embodiment of the invention. In FIG. 2(a), above, the resonatored MEMS bandpass filter device 100 was of a construction in which the input contact was connected to the lower contact plane with a conductive via. In FIG. 3(a), a metal contact 117 is dropped down from the surface to the bottom of the well 108 holding the resonator 111. The output signal pad 105 and tuning pad 104 are similar to those shown in FIG. 2(a). Again, as in FIG. 2(b), the resonator vibrates in the vertical direction as indicated by the arrow B in FIG. 3(b).

Figure 4A:
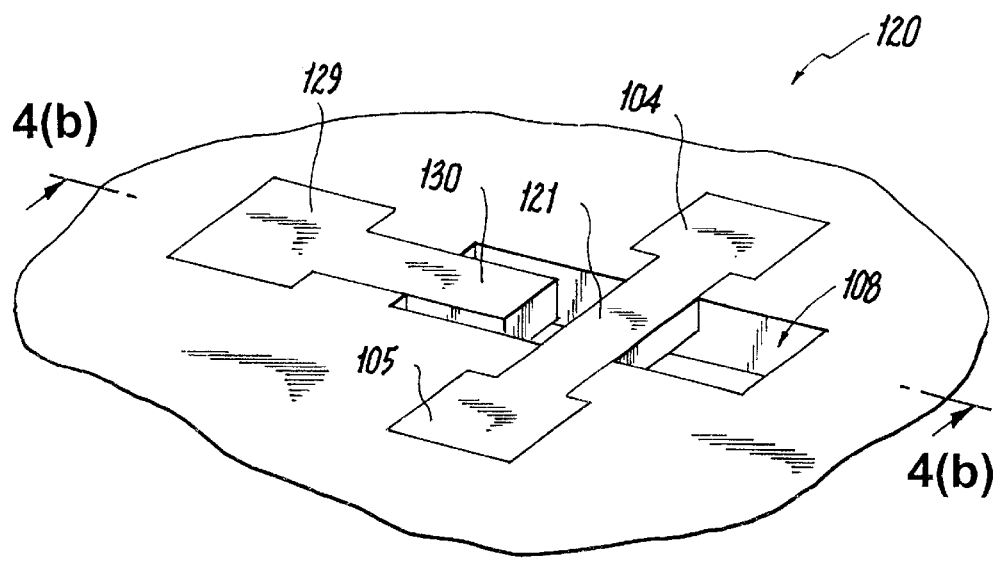
FIGS. 4(a) and 4(b) are schematic diagrams of a MEMS bandpass filter fabricated with the input contact causing horizontal oscillation of the resonator according to a third embodiment of the invention.
Figure 4B:
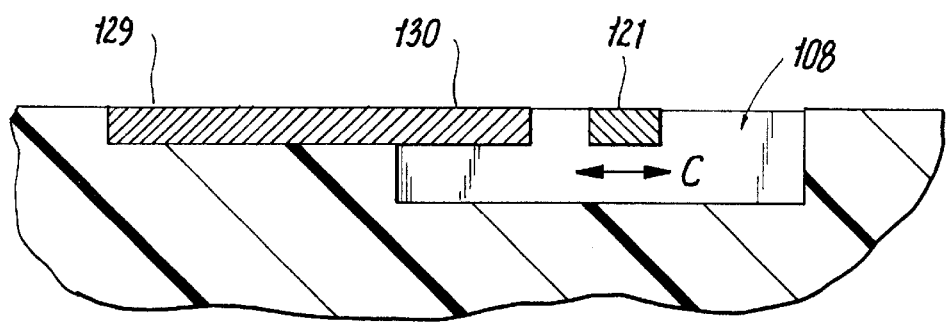

FIGS. 4(a) and 4(b) illustrate respective isometric and side views of a novel resonatored MEMS bandpass filter device 120 manufactured according to a third embodiment of the invention. In the embodiment illustrated in FIG. 4(a), input contact 129 and input contact extension 130 are formed in the same plane of the resonator 121, thus, eliminating the need to make a contact plane below the resonator, as is needed for the designs shown in FIGS. 2(a), 2(b) and FIGS. 3(a) and 3(b). Here, the resonator 121 vibrates horizontally rather than vertically as depicted by the arrow C in FIG. 4(b). This design is the simplest of the three variations to fabricate, however mechanical performance is reduced because of the edge surface roughness of the resonator in the direction of vibration. In designs of FIGS. 2(a) and 3(a), the resonator vibrates perpendicular to the surface of the substrate, and the top and bottom surfaces are as smooth as the SOI process can produce (normally <20 nm). However, the resonator design of FIG. 4(a) requires these surfaces to be defined by photolithography, which currently limits the roughness of edge definition to about 100 nm.

In accordance with the invention, the process used to fabricate each of the MEMS resonator bandpass filter devices utilizes silicon on insulator (SOI) substrates as the starting material. This material consists of a silicon wafer with a thin layers of $SiO_2$ and single crystal silicon on its surface (the silicon is the outmost layer). Such wafers are commercially available and are made using a variety of techniques. It is understood that the processes described herein are also applicable to silicon wafers only partially covered with SOI material. These wafers are constructed using the widely known SIMOX process (Separation by IMplanted OXygen) wherein only small areas of the surface are converted by using masks to form isolated areas of SOI material.

Typically, SOI wafers are constructed with the topmost single crystal silicon being about 200 nm thick, the SiO2 being 400 nm thick, and the substrate being several hundred microns thick. Other layer thickness of SOI substrates are available, and all are compatible with the processes described herein.

FIGS. 5(a)–5(k) illustrate the process steps in manufacturing a SOI MEMS device, e.g., the resonator structure 100 shown in FIG. 2(a).

Figure 5A:
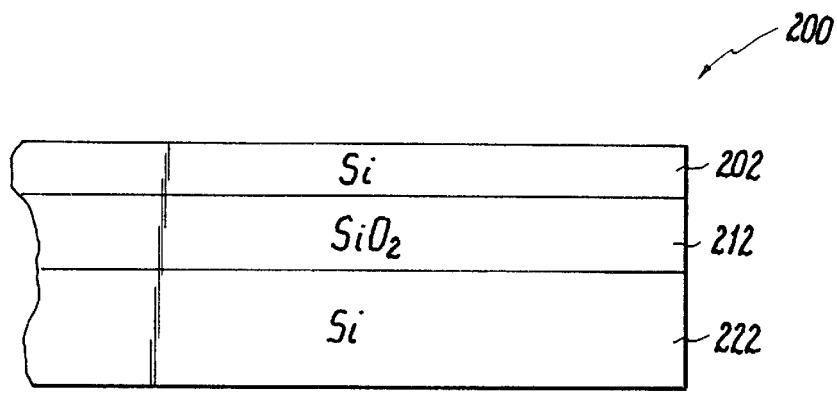
FIGS. 5(a)–5(k) illustrate the various masks used in construction of the device, and also depicts intermediate structures during the fabrication process.
Figure 5B:
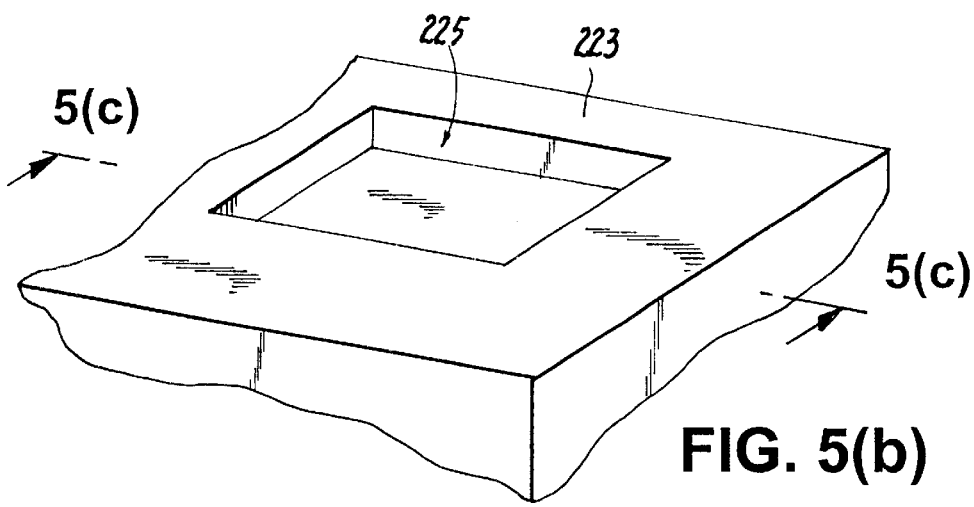
Figure 5C:
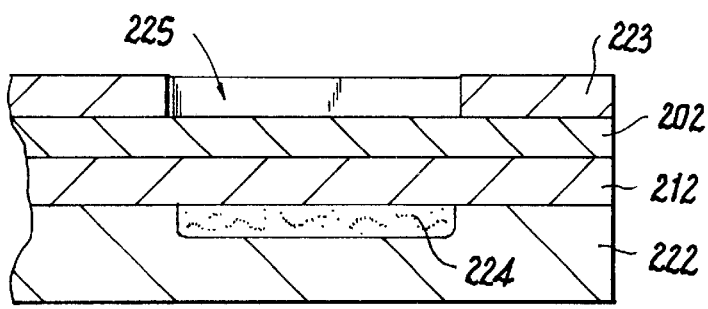
Figure 5D:
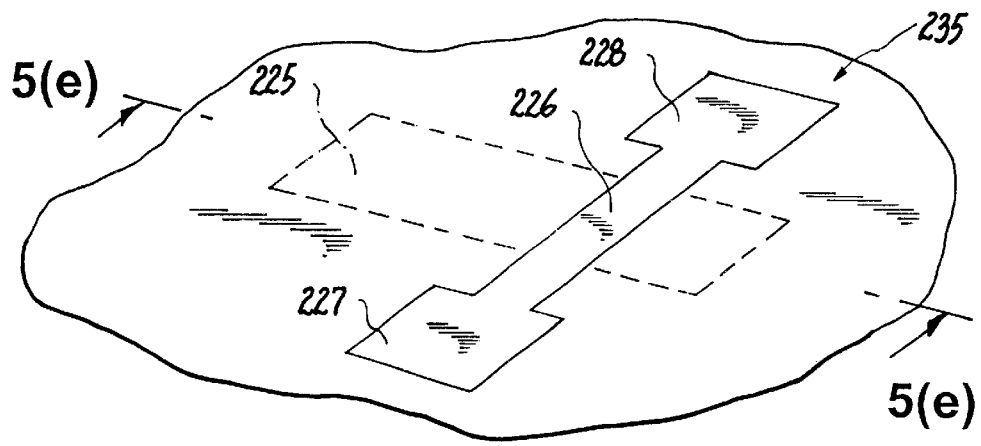
Figure 5E:
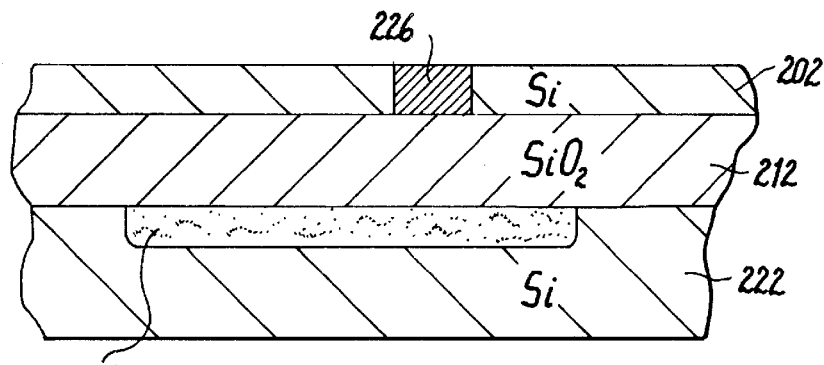

As shown in the cross-sectional view of FIG. 5(a), a clean p-type SOI wafer 200 is provided, having a surface silicon layer 202, an intermediate layer of $SiO_2$ 212 on the substrate silicon 222. For purposes of discussion, it is assumed that the surface silicon layer 202 is about 200 nm thick, the intermediate $SiO_2$ layer 212 is about 400 nm thick and, the silicon substrate 222 is p-type silicon, of nominal 10 Ω-cm resistivity. It is understood that none of these thickness specifications are critical to the device construction, and are used only for illustration. Next, as shown in FIG. 5(b), a thick photoresist layer 223 is applied to the silicon surface, and implementing photolithography, a long rectangle 225 is opened, that is, for example, about 4 mm×1 mm in size. Then, as shown in the cross-sectional view of FIG. 5(c), phosphorus ions are implanted, for example, at 440 keV to a dose of $10^{15}/cm^2$ through the opening 225 to create an $n^+$ layer 224 in the substrate 222, just below the $SiO_2$ layer 212, and spatially limited by the mask 223. The $n^+$ phosphorus layer 224 forms the buried conductive layer 224 of the resultant resonator bandpass filter device. Then, as indicated in FIG. 5(d), the old photoresist layer 223 (FIG. 5(c)) is removed, and a new photoresist coating is applied so that a second opening 235 may be created using photolithography. This second opening 235 corresponds to the resonator 226 and its electrical contacts, 227 and 228 and is related to the prior opening 225 as illustrated by the dotted-line rectangle. Next, as illustrated in FIG. 5(e), boron ions are implanted at 15 keV to a dose of $10^{15}/cm^2$ through the opening 235 to create a $p^+$ layer in the silicon layer 202 where the resonator 226 is to be constructed. At this point, the old photoresist is removed. Furthermore, at this point, the wafer may be annealed to remove any radiation damage from the implants, and to activate the B (boron) and P (phosphorus) impurities. A typical anneal process may be implemented in forming gas at 950° C. for 30 minutes.

Figure 5F:
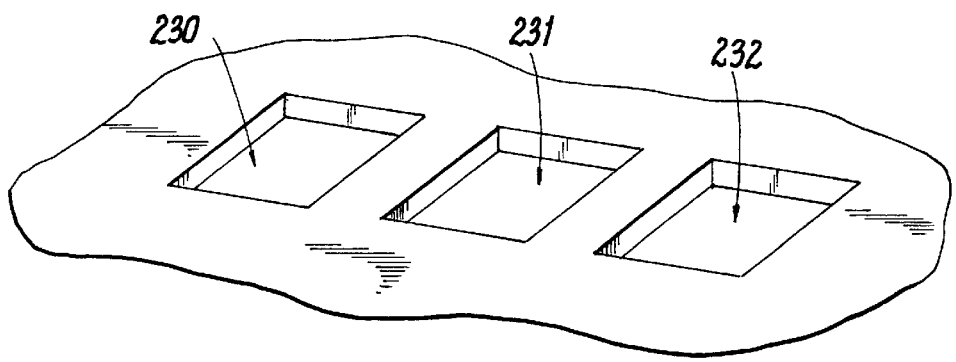
Figure 5G:
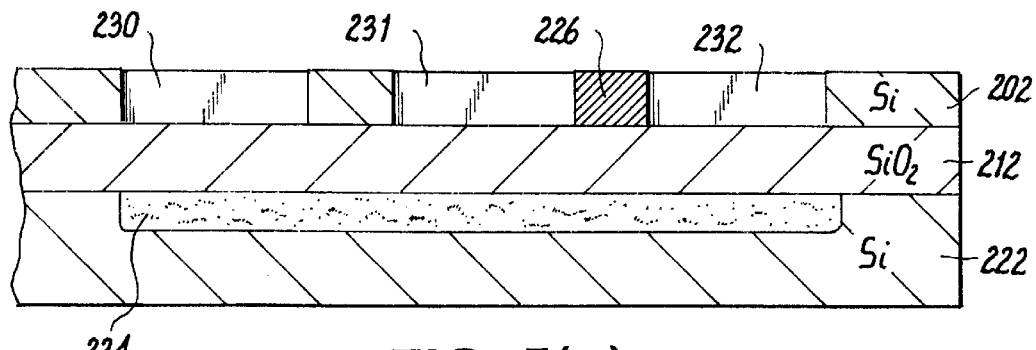

The next step requires the application of a new photoresist coating so that a photolithography technique may be used to open three rectangles 230, 231 and 232 at the surface as illustrated in FIG. 5(f). These three holes fit inside the opened rectangle 225. The relationship of the three holes to the resonator is such that, in a subsequent etch process performed through the surface silicon 202 exposed by presence of the three holes 230–232, the resonator Boron implant region 226 is sandwiched between two holes 231 and 232 at the silicon surface layer 202 such as shown in FIG. 5(g). A liquid silicon etch such as Ethylene-Dimene-PyroCatehcol Pyrozine (EPPW) may be used, however, according to a preferred embodiment, a reactive ion silicon etch (RIE) using $CF_4+O_2$ (10%) is used because it will leave more abrupt edges. The structure after this step is illustrated in FIG. 5(g), which shows the relationship of the three holes to the resonator 216 and the buried conductive layer 224.

Figure 5H:
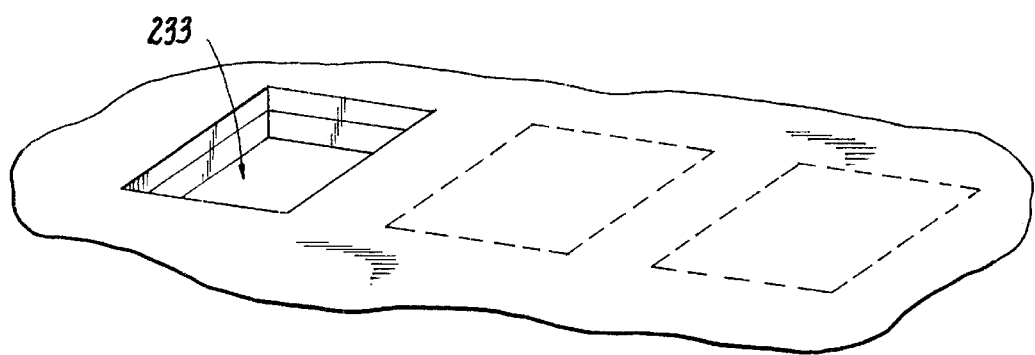

Next, as shown in FIG. 5(h), the old photoresist is removed, and a new photoresist coating is applied so that a photolithography technique may be used to open a rectangle 233 that is substantially aligned with the original rectangle 230 (see FIG. 5(f)). Further, an etch process is performed to etch through opening 233, removing the $SiO_2$ layer using an etchant such as buffered HF, down to the phosphorus implant layer 224.

Figure 5I:
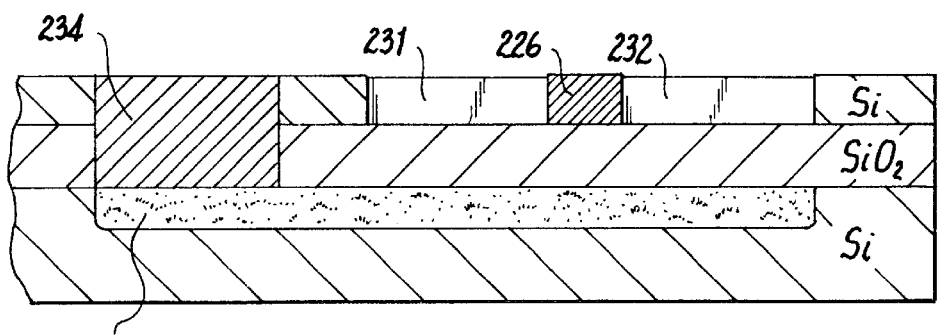

As shown in FIG. 5(i), a conducting metal, typically Ti (50 nm thick) followed by Al (550 nm thick) is deposited on the wafer to form the metal contact 234. Specifically, the prior photoresist layer is removed which enables all of the Ti and Al to be removed from the wafer except for that portion which was deposited within the hole 233 etched in the prior step. Thus, the hole 233 is filled with metal 234, enabling electrical contact from the surface 201 to the buried phosphorus implant layer 224.

Figure 5J:
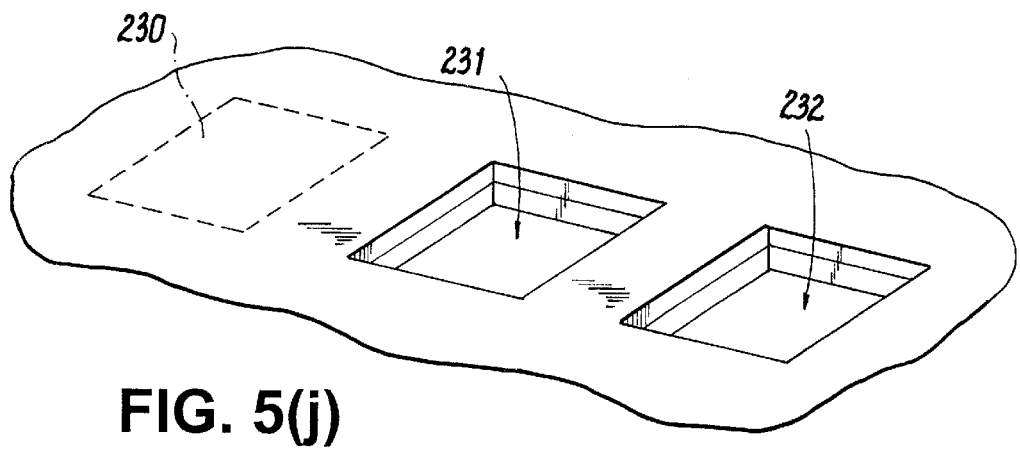

Next, as shown in FIG. 5(j), a new photoresist coating is applied so that a photolithography technique may be used to open two rectangles, substantially aligned with the remaining two prior fabricated rectangular openings 231 and 232 (see FIG. 5(f)).

Figure 5K:
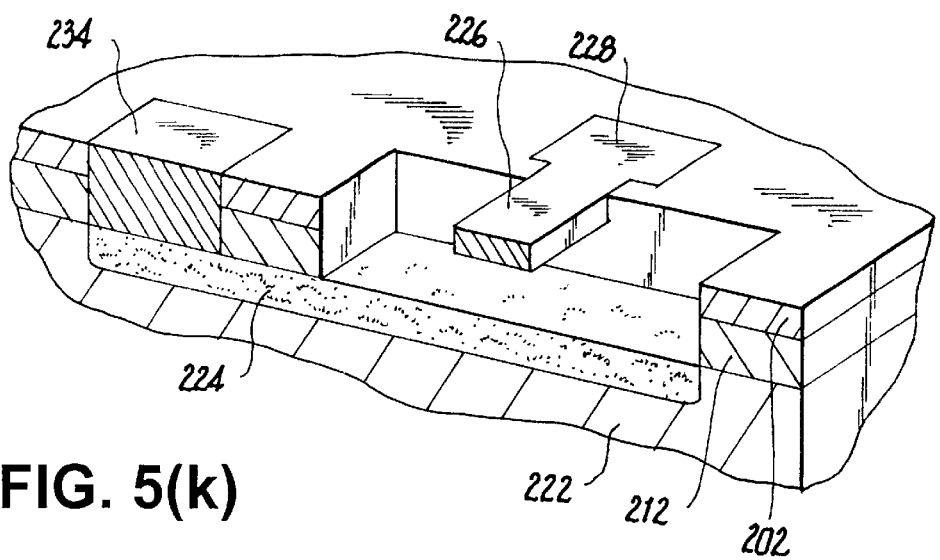

Finally, as indicated in FIG. 5(k), an etching process is performed to etch down through holes 231 and 232, through the $SiO_2$ layer, utilizing an etchant, e.g., buffered HF. Preferably, the etching continues until the $SiO_2$ under the resonator 226 (between the two open rectangles, 231 and 232) is fully removed, leaving a resonator structure as shown in the cross-sectional view of FIG. 5(k). Except for connection to other circuit elements, the basic band-pass filter structure 100 of FIG. 2(a) is completed.

In operation, as shown in FIG. 5(k), an input signal is conducted down the metal layer 234 to the deep contact 224. Specifically, the input is the reach-through contact 234, which transmits the signal to the buried phosphorus layer 224. This layer is n-type (phosphorus doped silicon) and has junction isolation from the p-type substrate 222. Layer 224 capacitively couples the input signal to the resonator 226, and enables the resonator to vibrate at its natural mechanical frequencies, filtering signals which will transmitted to the output electrical pad 228. Specifically, the signal propagates through the buried layer 224 until it is under the resonator 226. An image charge is induced in the resonator, and it will mechanically distort towards the buried layer. For electrical signals in resonance with the natural mechanical frequencies of the structure, the resonator will vibrate and capacitively propagate the signal through the P⁺ doped layer to the output contact 228. As shown in FIG. 5(d), a second contact 227 is placed at the other end of the resonator 226, which may be used for frequency tuning. For example, a small current, e.g., of about 10 mA, injected at second contact 227, will raise the temperature of the resonator to about 150° C., changing the resonator natural vibrational frequency and allowing the band-pass filter to be tuned.

In accordance with the principles of the invention described herein, similar procedures may be used to construct the variations on the above MEMS resonator device, such as shown in FIGS. 3 and 4. It should be apparent that manufacture of the resonator device structure 110 of FIG. 3(a) is the same but, does not require the phosphorus implant steps as depicted in FIGS. 5(b) and 5(c) above, nor, the reach-through etch and metallization steps as depicted in FIGS. 5(h)–5(i). Rather, the final bottom contact 117 is formed by depositing a metal layer using a technique such as electroplating to cover the bottom of the well 108 beneath the resonator.

Additionally, as mentioned, the MEMS resonator device 120 of FIG. 4(a) vibrates parallel to the wafer surface, and innovates in the inclusion of the single-crystal silicon resonator constructed in accordance with the processes described above.

Furthermore, as mentioned, the natural frequency of the resonator structures described herein may be altered by ion implantation into the resonator. Such an implant may be done using the same mask as described with respect to FIG. 5(d), above, and may follow the boron implant process step depicted in FIG. 5(e). Such ion implantation may be used to alter the resonator elastic constant in two ways: (1) by changing the density of the material, or (2) by changing the internal bonding structure of the material. The general formula which describes the natural fundamental frequency of a resonator beam supported at both ends is derived in the reference entitled "vibration and Sound", e.g., Chapter IV "The Vibration of Bars", by P. M. Morse, McGraw Hill Book Co., New York (1948), the contents of which are incorporated herein by reference, and set forth in equation (1) as follows:

$$\text{Fundamental Frequency} = K \frac{T}{L^2} \sqrt{\frac{Y}{\rho}} \qquad (1)$$

where K is a constant, T is the beam thickness, L is the beam length, Y is the elastic constant of the beam material, and $\rho$ is the beam material density. Examples of processes which may be used to alter the resonator frequency (after subsequent annealing) include the following:

1) Ion implantation of neutral light atoms such as carbon will, after anneal, maintain the same single-crystal structure of the resonator but lowers the resonator density, and hence raises its natural frequency of vibration. It is understood that neutral atoms are those which are chemically similar to silicon, and may be directly incorporated into the silicon crystal lattice.

2) Implantation of neutral heavy atoms such as germanium which raises the resonator material density, and lowers the natural frequency of vibration; and, 3) Implantation of dopant substitutional atoms such as B, As or P will change the local bonding of the silicon, and also effect the elastic constant of the resonator.

The resonator frequency may also be lowered by reducing the thickness of the resonator. This may be simply done by oxidizing and then etching the silicon prior to any processing, and reducing the thickness of the surface silicon The resonator frequency may also be raised by increasing the thickness of the resonator. This may be done by growing epitaxial silicon on the wafer prior to any other processing.

The resonator frequency may be also raised by the deposition of any material upon the resonator structure to increase its thickness. However, any material other than single-crystal silicon will degrade the device performance by introducing internal friction losses.

The width of the band-pass filter may be too narrow for some applications. This frequency width maybe increased (widened) by ion implantation of the resonator surface with silicon atoms, partially converting it to polycrystalline or amorphous silicon.

However, as noted above, internal friction from such materials reduces the device efficiency and also widens the band-pass by distorting the natural vibrational frequency.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. An integrated circuit resonator device of single crystal silicon comprising:

a) a substrate including a top surface single crystal silicon layer, and an intermediate layer of $SiO_2$ formed thereon;

b) a conductive contact formed at said surface silicon layer for receiving an input electrical signal;

c) an open well structure formed in said silicon surface, said well having a bottom surface conductive layer connecting said input contact; and, d) a resonator structure formed at said surface silicon layer and lying across said well structure below the silicon surface, wherein an input signal is capacitively coupled from said bottom surface conductive layer to said resonator structure to enable vibration of said resonator device in a vertical direction at a desired frequency of vibration, said structure lying below the silicon surface allowing further processing of the integrated circuit.

2. The device as claimed in claim 1, wherein said resonator structure includes a first conductive contact formed at a surface at one side of said open well structure for further propagating input signals at said desired frequency.

3. The device as claimed in claim 1, wherein said resonator structure includes a second conductive contact formed at a surface at an opposite side of said open well structure for enabling injection of electrical stimulus for heating said resonator structure and altering its frequency of vibration.

4. The device as claimed in claim 1, wherein said resonator structure comprises a material for altering a band-pass frequency of vibration, said material comprising one selected from a group including: carbon atoms, germanium, boron, and, arsenic.

5. An integrated circuit resonator device of single crystal silicon comprising:

a) a substrate including a top surface single crystal silicon layer, and an intermediate layer of $SiO_2$ formed thereon;

b) an open well structure formed in said silicon surface;

c) a conductive contact formed at said surface silicon layer near one end of said open well structure layer for receiving an input electrical signal, said contact including contact portion at said surface silicon layer extending over said open well structure; and, d) a resonator structure formed at said surface silicon layer and lying across said well structure below the silicon surface in proximity with said extending contact portion, wherein an input signal is capacitively coupled from said extending contact portion to said resonator structure to enable vibration of said resonator device in a horizontal direction at a desired frequency of vibration, said resonator structure lying below the silicon surface allowing further processing of the integrated circuit.

6. The device as claimed in claim 5, wherein said resonator structure includes a first conductive contact formed at a surface at one side of said open well structure for further propagating input signals at said desired frequency.

7. The device as claimed in claim 5, wherein said resonator structure includes a second conductive contact formed at a surface at an opposite side of said open well structure for enabling injection of electrical stimulus for heating said resonator structure and altering its frequency of vibration.

8. The device as claimed in claim 5, wherein said resonator structure comprises a material for altering a band-pass frequency of vibration, said material comprising one selected from a group including: carbon atoms, germanium, boron, and, arsenic.

* * * * *